United States Patent
Locher et al.

(10) Patent No.: US 9,926,645 B2
(45) Date of Patent: *Mar. 27, 2018

(54) METHOD OF FORMING A SINGLE CRYSTAL SHEET USING A DIE HAVING A THERMAL GRADIENT ALONG ITS LENGTH

(71) Applicant: Saint-Gobain Ceramics & Plastics, Inc., Worcester, MA (US)

(72) Inventors: John Walter Locher, Amherst, NH (US); Steven Anthony Zanella, Dublin, NH (US); Ralph Lampson MacLean, Jr., Manchester, NH (US); Herbert Ellsworth Bates, Peterborough, NH (US)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/489,415

(22) Filed: Apr. 17, 2017

(65) Prior Publication Data

US 2017/0342591 A1   Nov. 30, 2017

Related U.S. Application Data

(60) Continuation of application No. 14/176,437, filed on Feb. 10, 2014, now abandoned, which is a division of
(Continued)

(51) Int. Cl.
   *C30B 15/34*   (2006.01)
   *C30B 15/30*   (2006.01)
   *C30B 29/20*   (2006.01)

(52) U.S. Cl.
   CPC .............. *C30B 15/30* (2013.01); *C30B 15/34* (2013.01); *C30B 29/20* (2013.01);
   (Continued)

(58) Field of Classification Search
   CPC ......... C30B 15/00; C30B 15/14; C30B 15/20; C30B 15/22; C30B 15/24; C30B 15/30;
   (Continued)

(56) References Cited

U.S. PATENT DOCUMENTS 3,369,160 A   2/1968   Koppel et al.
3,380,406 A   4/1968   Gosnell
(Continued)

FOREIGN PATENT DOCUMENTS

CN   87108007 A   6/1988
CN   1058055 A    1/1992
(Continued)

OTHER PUBLICATIONS

Locher, et al. publication entitled "Large diameter sapphire window from single crystal sheets," Proceedings of the 5th DOD Electromagnetic Window Symposium, Oct. 1993. (Year: 1993).*
(Continued)

*Primary Examiner* — Kenneth A Bratland, Jr.
(74) *Attorney, Agent, or Firm* — Abel Law Group, LLP; Robert N. Young

(57) ABSTRACT

Various single crystals are disclosed including sapphire. The single crystals have desirable geometric properties, including a width not less than about 15 cm and the thickness is not less than about 0.5 cm. The single crystal may also have other features, such as a maximum thickness variation, and as-formed crystals may have a generally symmetrical neck portion, particularly related to the transition from the neck to the main body of the crystal. Methods and for forming such crystals and an apparatus for carrying out the methods are disclosed as well.

12 Claims, 6 Drawing Sheets

Related U.S. Application Data application No. 13/396,288, filed on Feb. 14, 2012, now Pat. No. 8,685,161, which is a continuation of application No. 12/021,758, filed on Jan. 29, 2008, now Pat. No. 8,157,913, which is a division of application No. 10/820,468, filed on Apr. 8, 2004, now Pat. No. 7,348,076.

(52) U.S. Cl.
CPC .... *Y10T 117/1044* (2015.01); *Y10T 428/2495* (2015.01); *Y10T 428/26* (2015.01)

(58) Field of Classification Search
CPC ......... C30B 15/34; C30B 29/00; C30B 29/20; Y10T 117/00; Y10T 117/1016; Y10T 117/1024; Y10T 117/1032; Y10T 117/1036; Y10T 117/1044; Y10T 117/1068; Y10T 428/2495; Y10T 428/26
USPC ..... 117/11, 13, 23–24, 26, 30, 35, 200, 204, 117/206, 208–209, 211, 922, 937, 950
See application file for complete search history.

(56) References Cited

U.S. PATENT DOCUMENTS

| | | |
|---|---|---|
| 3,471,266 A | 10/1969 | La Belle, Jr. |
| 3,591,348 A | 7/1971 | La Belle, Jr. |
| 3,608,050 A | 9/1971 | Carman et al. |
| 3,634,177 A | 1/1972 | Glaser |
| 3,846,082 A | 11/1974 | La Belle, Jr. et al. |
| 3,915,662 A | 10/1975 | Labelle et al. |
| 3,917,891 A | 11/1975 | Cooke et al. |
| 3,930,452 A | 1/1976 | Van Laethem et al. |
| 3,953,174 A | 4/1976 | La Belle, Jr. |
| 4,028,476 A | 6/1977 | Kleinschmidt et al. |
| 4,075,055 A | 2/1978 | Ciszek et al. |
| 4,077,934 A | 3/1978 | Lee, Jr. |
| 4,079,161 A | 3/1978 | Kile |
| 4,122,134 A | 10/1978 | Miki et al. |
| 4,126,731 A | 11/1978 | Nishizawa et al. |
| 4,158,038 A | 6/1979 | Jewett |
| 4,167,545 A | 9/1979 | Fahrbach et al. |
| 4,184,907 A | 1/1980 | Yates |
| 4,197,130 A | 4/1980 | Nakamura et al. |
| 4,234,676 A | 11/1980 | Hein et al. |
| 4,248,645 A | 2/1981 | Jewett |
| 4,248,981 A | 2/1981 | Milkovich et al. |
| 4,271,129 A | 6/1981 | Berkman et al. |
| 4,303,465 A | 12/1981 | Bagdasarov et al. |
| 4,323,637 A | 4/1982 | Chen et al. |
| 4,390,505 A | 6/1983 | Taylor et al. |
| 4,402,786 A | 9/1983 | Little |
| 4,416,723 A | 11/1983 | Pelts et al. |
| 4,430,417 A | 2/1984 | Heinz et al. |
| 4,443,411 A | 4/1984 | Kalejs |
| 4,460,675 A | 7/1984 | Gruetzmacher et al. |
| 4,578,429 A | 3/1986 | Gergen et al. |
| 4,704,943 A | 11/1987 | McDougal |
| 4,751,059 A | 6/1988 | McHugh et al. |
| 4,882,384 A | 11/1989 | Willis et al. |
| 4,894,315 A | 1/1990 | Feinberg et al. |
| 4,898,914 A | 2/1990 | Gergen et al. |
| 4,915,773 A | 4/1990 | Kravetsky et al. |
| 4,925,899 A | 5/1990 | Rendina et al. |
| 4,930,731 A | 6/1990 | Roy et al. |
| 4,940,650 A | 7/1990 | Kurtz et al. |
| 4,970,265 A | 11/1990 | Willis |
| 4,997,628 A | 3/1991 | Piotrowski |
| 5,037,622 A | 8/1991 | Harvey et al. |
| 5,041,783 A | 8/1991 | Ohta et al. |
| 5,112,725 A | 5/1992 | Kurtz et al. |
| 5,206,300 A | 4/1993 | Chamberlain |
| 5,250,390 A | 10/1993 | Gries |
| 5,276,101 A | 1/1994 | Chamberlain et al. |
| 5,356,113 A | 10/1994 | Mizuishi et al. |
| 5,398,640 A | 3/1995 | Locher et al. |
| 5,416,043 A | 5/1995 | Burgener et al. |
| 5,436,298 A | 7/1995 | Moczygemba et al. |
| 5,451,553 A | 9/1995 | Scott et al. |
| 5,472,824 A | 12/1995 | Schober et al. |
| 5,506,299 A | 4/1996 | Gelles et al. |
| 5,516,831 A | 5/1996 | Pottick et al. |
| 5,534,073 A | 7/1996 | Kinoshita et al. |
| 5,545,690 A | 8/1996 | Trepka et al. |
| 5,558,712 A | 9/1996 | Kalejs |
| 5,660,627 A | 8/1997 | Manente et al. |
| 5,705,569 A | 1/1998 | Moczygemba et al. |
| 5,758,845 A | 6/1998 | Sunne et al. |
| 5,910,546 A | 6/1999 | Trepka et al. |
| 6,009,789 A | 1/2000 | Lyons |
| 60,111,117 | 1/2000 | Perkins et al. |
| 6,031,053 A | 2/2000 | Knoll et al. |
| 6,036,775 A | 3/2000 | Imaeda et al. |
| 6,059,877 A | 5/2000 | Bruel |
| 6,096,828 A | 8/2000 | Deporter et al. |
| 6,143,633 A | 11/2000 | Bathey |
| 6,177,236 B1 | 1/2001 | Apte |
| 6,197,889 B1 | 3/2001 | Knoll et al. |
| 6,265,485 B1 | 7/2001 | Trepka et al. |
| 6,326,127 B1 | 12/2001 | Morren et al. |
| 6,413,311 B2 | 7/2002 | Melcher et al. |
| 6,420,486 B1 | 7/2002 | Deporter et al. |
| 6,475,942 B1 | 11/2002 | Brewer et al. |
| 6,521,712 B1 | 2/2003 | Knoll et al. |
| 6,593,430 B1 | 7/2003 | Knoll et al. |
| 6,642,989 B2 | 11/2003 | Umehara et al. |
| 6,692,568 B2 | 2/2004 | Cuomo et al. |
| 6,733,700 B2 | 5/2004 | Houston et al. |
| 6,967,617 B1 | 11/2005 | McMillan et al. |
| 7,012,118 B2 | 3/2006 | Hansen et al. |
| 7,141,621 B2 | 11/2006 | St. Clair et al. |
| 7,160,949 B2 | 1/2007 | Ota et al. |
| 7,163,731 B2 | 1/2007 | Yeshurun et al. |
| 7,175,704 B2 | 2/2007 | D'Evelyn et al. |
| 7,241,540 B2 | 7/2007 | St. Clair et al. |
| 7,282,381 B2 | 10/2007 | Feltin et al. |
| 7,285,509 B2 | 10/2007 | Bayya et al. |
| 7,348,076 B2 | 3/2008 | Locher et al. |
| 7,584,689 B2 | 9/2009 | Jones et al. |
| 7,793,580 B2 | 9/2010 | Jones et al. |
| 8,025,004 B2 | 9/2011 | Jones et al. |
| 8,157,913 B2 * | 4/2012 | Locher ................... C30B 15/34 117/23 |
| RE43,469 E | 6/2012 | Locher et al. |
| 8,297,168 B2 | 10/2012 | Jones et al. |
| 2003/0105259 A1 | 6/2003 | Heemann et al. |
| 2003/0166776 A1 | 9/2003 | Wright et al. |
| 2003/0176582 A1 | 9/2003 | Bening et al. |
| 2004/0099206 A1 | 5/2004 | Ackermann et al. |
| 2005/0227117 A1 | 10/2005 | Locher et al. |
| 2005/0247260 A1 | 11/2005 | Shin et al. |
| 2007/0068375 A1 | 3/2007 | Jones et al. |
| 2007/0068376 A1 | 3/2007 | Jones et al. |
| 2008/0075941 A1 | 5/2008 | Tatartchenko et al. |
| 2008/0282968 A1 | 11/2008 | Amosov |
| 2009/0130415 A1 | 5/2009 | Mack, III et al. |
| 2009/0308239 A1 | 12/2009 | Jones et al. |
| 2010/0288117 A1 | 11/2010 | Jones et al. |
| 2012/0001027 A1 | 1/2012 | Jones et al. |

FOREIGN PATENT DOCUMENTS

| | | |
|---|---|---|
| DE | 202901 B1 | 10/1983 |
| EP | 493903 A1 | 7/1992 |
| EP | 696761 A1 | 2/1996 |
| EP | 2082081 A1 | 7/2009 |
| GB | 2044630 A | 10/1980 |
| JP | 51-136581 A | 11/1976 |
| JP | S52143978 A | 11/1977 |
| JP | S55-121996 A | 9/1980 |
| JP | 56-059693 A | 5/1981 |
| JP | 57095899 A | 6/1982 |
| JP | S57118091 A | 7/1982 |

(56) References Cited

FOREIGN PATENT DOCUMENTS

| JP | S57-175795 | A  | 10/1982 |
|----|------------|----|---------|
| JP | H03-2503   | A  | 1/1991  |
| JP | H05-81178  | B2 | 11/1993 |
| JP | 2001-085746| A  | 3/2001  |
| JP | 2001-118837| A  | 4/2001  |
| JP | 2003112998 | A  | 4/2003  |
| JP | 2003-313092| A  | 11/2003 |
| JP | 2003327495 | A  | 11/2003 |
| JP | 2008522874 | A  | 7/2008  |
| JP | 2010504274 | A  | 2/2010  |
| RU | 1816664    | A1 | 5/1993  |
| SU | 1758913    | A1 | 8/1992  |
| WO | 2003068501 | A1 | 8/2003  |
| WO | 2005100646 | A1 | 10/2005 |
| WO | 2006135832 | A2 | 12/2006 |
| WO | 2007058665 | A2 | 5/2007  |
| WO | 2008036888 | A1 | 3/2008  |
| WO | 2008130457 | A2 | 10/2008 |
| WO | 2009067641 | A2 | 5/2009  |

OTHER PUBLICATIONS

Joint Declaration of Inventors John W. Locher and Steven A. Zanella dated May 4, 2017, pp. 1-17.
Computerized project log created and maintained by inventor Steven Zanella, dated from Jun. 8, 2000-Mar. 11, 2004, pp. 1-15.
Pages from the notebook of John Locher, dated Sep. 26, 2003-Nov. 21, 2003, pp. 1-9.
Affidavit regarding Internet Archive record, dated Jan. 26, 2016, pp. 1-7.
"Properties and Benefits of Sapphire: A Quick Reference Guide", Saphikon, Inc., Saint-Gobain Semiconductor. Http://web.archive.org/web/20030315075922/http://www.saphikon.com/qrg.pdf. Mar. 15, 2003.
Australian Examiners Report dated Apr. 1, 2010 issued in Australian application No. 2007299677, 3 pages.
Sandstrom, Donald J., "Armor Anti-Armor Materials by Design," Los Alamos Science, Summer 1989, 15 pages.
Schmid, F. et al., "Producing large Sapphire for optical applications." American Ceramic Society Bulletin, 1994, pp. 39-44, vol. 73 No. 2.
Khattak, C.P. et al., "Correlation of sapphire quality with uniformity and optical properties." Proceedings of SPIE, 1997, pp. 250-257, vol. 3060.
Schmid, F. et al., "Growth of very large sapphire crystals for optical applications." Proceedings of SPIE, (1998), pp. 37-46, vol. 3424.
Schmid, F. et al. "Current Status of very large sapphire crystal growth for optical applications." Proceedings of SPIE, 1999, pp. 70-76, vol. 3705.
Askinazi, J. et al., "Development of large-aperture monolithic sapphire optical windows." Proceedings of SPIE, 2001, pp. 1-11, vol. 4375.
European Office Action dated Aug. 11, 2008 issued in corresponding European Patent Application No. 06 772 823.8, 3 pages.
Canadian Office Action dated Sep. 3, 2008 issued in Canadian Patent Application No. 2,560,998, 4 pages.
Chinese Office Action dated Jul. 4, 2008 issued in Chinese Patent Application No. 200580012188.0, 18 pages.
International Search Report dated Jul. 28, 2005 issued in PCT Application No. PCT/US2005/011404, 3 pages.
Written Opinion issued in PCT Patent Application No. PCT/US2005/011404, 5 pages, dated Jul. 26, 2005.
U.S. Office Action dated Jul. 28, 2005 issued in U.S. Appl. No. 10/820,468, 13 pages.
U.S. Office Action dated Mar. 9, 2006 issued in U.S. Appl. No. 10/820,468, 7 pages.
U.S. Office Action dated Dec. 4, 2006 issued in U.S. Appl. No. 10/820,468, 7 pages.
European Office Action dated Feb. 23, 2009 issued in European Patent Application No. 06 772, 823.8, 3 pages.
European Office Action dated Mar. 19, 2008 issued in corresponding European Patent Application No. 06 772, 823.8, 5 pages.
International Search Report dated Nov. 22, 2006 issued in PCT Application No. PCT/US2006/026677, 5 pages.
Australian Examiners Report dated Mar. 24, 2009 cited in Australian application No. 2006257867, 2 pages.
Written Opinion issued in PCT Patent Application No. PCT/US2006/022677, dated Nov. 22, 2006, 9 pages.
Saint-Gobain Crystals & Detectors; Quotation of Sapphire Plate; Apr. 7, 2003; 2 pages.
International Search Report and Written Opinion dated May 26, 2009 issued in PCT International Application No. PCT/US08/84277, 12 pages.
Gentilman, R. et al., "Low-cost sapphire windows," Society of Photo-Optical Instrumentation Engineers; SPIE; 2003; 6 pages, vol. 5078.
Gentilman, R. et al., "Large-area sapphire windows," Society of Photo-Optical Instrumentation Engineers, 2003, SPIE; 7 pages, vol. 5078.
Abstract for the 30th International Conference and Exposition on Advanced Cermaics and Composites: Large EFG Sapphire for Transport Armor. ControiiD:191574. Jan. 22-28, 2006, 1 page.
Jones, Christopher D. et al., "Large-Area Sapphire for Transport Armor," American Ceramic Society Bulletin, Mar. 2006, 6 pages. vol. 85, No. 3.
Locher, J.W., et al. "The Production of 225×325 mm sapphire windows for IR (1-5 μm) Applications", Window and Dome Technologies VIII, Proceedings of SPIE, 2003, pp. 40-46, vol. 5078.
Harris, D. C. A Century of Sapphire Crystal Growth. Proceedings of the 10th D0D Electromagnetic Windows Symposium, Norfolk, Virginia, May 2004, p. 35. URL: http://www.dtic.mil/cgibin/GetTRDoc?Location=U2&doc=GetTRDoc.pdf&AD=ADA460239.
Wada, Kazumi et al. "Growth and Characterization of Sapphire Ribbon Crystals" Journal of Crystal Growth, Feb. 27, 1979, pp. 151-159, vol. 50, North-Holland Published Company.
Labelle, Jr., H. E. "EFG, the Invention and Application to Sapphire Growth" Journal of Crystal Growth Oct. 30, 1979, pp. 8-17, vol. 50, North-Holland Published Company.
Antonov, P.I., et al., "A Review of Developments in Shaped Crystal Growth of Sapphire by the Stepanov and Related Techniques," Progress of Crystal Growth and Characterization of Materials, 2002, pp. 63-122.
Novak, R.E., et al., "The Production of EFG Sapphire Ribbon for Heteroepitaxial Silicon Substrates," Journal of Crystal Growth, 1980, pp. 143-150, vol. 50.
Patel, Parimal J. et al., "Transparent Armor," AMPTIAC, The AMPTIAC Newsletter, Fall 2000, 24 pages, vol. 4, No. 3.
International Preliminary Report on Patentability, Application No. PCT/US2007/079149, dated Apr. 4, 2009, 9 pages.
Department of Defense; "Department of Defense Test Method Standard—V50 Ballistic Test for Armor" MIL-STD-662F; Dec. 18, 1997; 23 pages.
"Sniper XR—The World's Most Advanced Targeting Pod," Lockheed Martin Corp., 2003; 2 pages. URL:<www.missilesandfirecontrol.com>.
Lundin, Laura; "AFRL Test Transparent Armor"UDRI News; Oct. 2005; 2 pages. URL: <http://www.udri.udayton.edu/news/news1005.htm>.
"Army Materials Research: Transforming Land Combat Through New Technologies," AMPTIAC Quarterly, 2004, 11 pages, vol. B, No. 4. URL: <http://amptiac.alionscience.com/quarterly>.
"Oran OSG Armor," Israel at Eurosatory 2004, 3 pages. URL: <www.oran.com>.
U.S. Appl. No. 11/423,203, Office Action dated Apr. 2, 2008, 14 pages.
U.S. Appl. No. 11/423,203, Office Action dated Oct. 31, 2008, 9 pages.
Buturi, Oyo, 1997, p. 938-p. 942, vol. 9 No. 46.
Ballard, Jr., Clifford P, "A Transparent Ceramic Armor," Sandia Laboratories Report; May 1978; 28 pages.
"Alon Optical Ceramic—Comparison to Window Materials", Surmet Corp., Company Literature #M301030, 1 page.

(56) References Cited

OTHER PUBLICATIONS

"HMMWV Lightweight Replacement Armored Door" Specs from web:www2.eps.gov, 3 pages.
"Transparent Armor Systems" US Armor Research Laboratory, 2 pages.
Harris, Daniel C, "Materials for Infrared Windows and Domes—Properties and Performance," SPIE—The International Society for Optical Engineering, SPIE Optical Engineering Press, 1999, 7 pages, Bellingham, US.
"Enhanced Vision System," Kollsman, Inc.; 2 pages. URL: <www.kollsman.com/products/commercial-aviation-systems/enahnced-vision-system.asp>.
U.S. Statutory Invention Registration #H1567 published on Aug. 6, 1996.
U.S. Appl. No. 11/423,210, Office Action dated Oct. 14, 2008, 8 pages.
U.S. Appl. No. 60/981,983 filed Oct. 23, 2007.
Declaration of John W. Locher, 5 pages, Oct. 14, 2009.
Ukrainian Office Action issued in Ukrainian Patent Application No. a 2009 02529/M dated Nov. 30, 2010, 4 pages.
"Emerging Scanning Results: Transparent Ceramics", PATH.US Army Research Laboratory, 2 pages. URL: <http://www.pathnet.org/sp.asp?id=7539>.
U.S. Appl. No. 12/021,758 Office Action dated May 3, 2011, 5 pages.
Wang et al., "Dislocation Anaylsis for Large-Sized Sapphire Single Crystal Grown by SAPMAC Method," Chinese Journal of Structural Chemisty, pp. 1332-1336, vol. 26, No. 11.
Machine English Translation of JP 2003-327495 retried from the JPO website on Oct. 2, 2010.
Flerov et al., "The way to producing of the perfect sapphire crystals," Mat. Res. Soc. Symp., 1994, pp. 51-56, vol. 329.
Miyazawa, "Optical Crystals Survived in Information Technology Systems," Opto-Electronics Review, 2003, pp. 77-84, vol. 11.
U.S. Appl. No. 11/423,203, filed Jun. 9, 2006, Inventors: Christopher D. Jones et al.
U.S. Appl. No. 12/549,985, filed Aug. 28, 2009, Inventors: Christopher D. Jones et al.
U.S. Appl. No. 13/231,109, filed Sep. 13, 2011 Inventors: Christopher D. Jones et al.
U.S. Appl. No. 60/689,688, filed Jun. 10, 2005 Inventors: Christopher D. Jones et al.
U.S. Appl. No. 60/761,814, filed Jan. 25, 2006 Inventors: Christopher D. Jones et al.
U.S. Appl. No. 11/858,949, filed Sep. 21, 2007 Inventors: Vitali Tatartchenko et al.
Locher et al., "Large Diameter sapphire window from Single Crystal Sheets," Proceedings of the 5th DID Electromagnetic Window Symposium. Oct. 1993.
Request for Supplemental examination for control No. 96/000,210, dated May 4, 2017, pp. 1-43.
Reasons for substantial new questions of patentability determination for control No. 96/000,210, dated Jun. 22, 2017, pp. 1-10 (11 pages total with cover sheet).
Supplemental Examination Certificate for control No. 96/000,210, dated Jun. 22, 2017, p. 1 (2 pages total with cover sheet).
Request for Supplemental examination for control No. 96/000,211, dated May 4, 2017, pp. 1-42.
Ex parte reexamination ordered for control No. 96/000,211, dated Jul. 18, 2017, 2 pages.
Supplemental Examination Certificate for control No. 96,000,211, dated Jul. 13, 2017, p. 1 (2 pages total with cover sheet).
Reasons for substantial new questions of patentability determination for control No. 96/000,211, dated Jul. 13, 2017, pp. 1-10 (11 pages total with cover sheet).
Non-Final Office Action for control No. 96/000,211, dated Jul. 25, 2017, pp. 1-12 (14 pages total with cover sheet and PTO-892).
Response to Office Action in ex parte reexamination for control No. 96/000,211, dated Sep. 25, 2017, pp. 1-13.
Joint declaration of inventors John W. Locher and Steven A. Zanella under 37 CFR 1.132, dated Sep. 25, 2017, pp. 1-24 (25 pages total).
Supplemental response to Office Action in ex parte reexamination for control No. 96/00,211, dated Oct. 17, 2017, pp. 1-8.
Statement of reasons for patentability and/or confirmation for control No. 96/000,211, dated Nov. 9, 2017, pp. 1-2 (3 pages total with cover sheet).
U.S. Statutory Invention Registration #H1519 published on Mar. 5, 1996.
Jones, Christopher D. et al., "Large EFG Sapphire for Transparent Armor," Abstract for the 30th International Conference and Exposition on Advanced Ceramics and Composites, Control ID: 191574, Jan. 22-27, 2006, 1 page.
Lundin, Laura; "Air Force Testing New Transparent Armor," Air Force Research Laboratory Public Affairs, Air Force Link; Oct. 17, 2005; 2 pages. URL: <http://www.af.mil/news/story asp?id=123012131>.
U.S. Appl. No. 60/989,756, filed Nov. 21, 2007.
Denislov. A V. et al., "Optical Anomalies and Residual Stresses in Basal-Plane-Faceted Ribbons of Stepanov-Grown Sapphire Crystals," Defects and Impurity Centers, Dislocations, and Physics of Strength, ISSN1063-7834, Physics of the Solid State, Pleiades Publishing, Ltd., 2007, pp. 472-477, vol. 49, No. 3.
U.S. Appl. No. 12/274,593, filed Nov. 20, 2008.
U.S. Appl. No. 11/423,210, filed Jun. 9, 2006, Inventors: Christopher D. Jones et al.
U.S. Appl. No. 12/845,611, filed Jul. 28, 2010, Inventors: Christopher D. Jones et al.
U.S. Appl. No. 11/858,949, filed Sep. 21, 2007, Inventors: Vitali Tatartchenko et al.
U.S. Appl. No. 60/826,723, filed Sep. 22, 2006 Inventors: Vitali Tatartchenko et al.
Jones, Christopher D. et al., "Large-Area Sapphire for Transparent Armor," American Ceramic Society Bulletin, Mar. 2006, 6 pages, vol. 85, No. 3.
Locher et al., "Large Diameter sapphire window from Single Crystal Sheets," Proceedings of the 5th DOD Electromagnetic Window Symposium. Oct. 1993.
"Enhanced Vision System," Kollsman, Inc.; 2 pages. URL: <www.kollsman.com/products/commercial-aviation-systems/enahnced-vision-system.asp>, downloaded Jan. 5, 2007.
"Oran OSG Armor," Israel at Eurosatory 2004, Exhibition dates Jun. 14-18, 2004, 3 pages.
"Emerging Scanning Results: Transparent Ceramics", PATH.US Army Research Laboratory, 2 pages. URL: <http://www.pathnet.org/sp.asp?id=7539>, content updated Apr. 14, 2003, downloaded on Apr. 8, 2008.
Wang et al., "Dislocation Analysis for Large-Sized Sapphire Single Crystal Grown by SAPMAC Method," Chinese Journal of Structural Chemistry, pp. 1332-1336, vol. 26, No. 11., dated 2007.
English language translation of Russian Office Action issued in Russian Patent Application No. 2006135362, received Jun. 2008, 4 pages.
Price quotation previously submitted in reissue patent application RE43469, Apr. 7, 2003, pp. 1-2.
Spreadsheet that shows the date Growth 7131-6 was created and correlates Growth 7131-6 with Crystals No. 166574, dated from Nov. 14, 2002-Aug. 15, 2013, pp. 1-4.
Creation record of Growth 7131-1 (Crystal No. 166298), dated Nov. 5, 2002, pp. 1-2.
Creation record of Growth 7131-2 (Crystal No. 166330), dated Nov. 6, 2002, pp. 1-2.
Creation record of Growth 7131-3 (Crystal No. 166367), dated Nov. 7, 2002, pp. 1-2.
Creation record of Growth 7131-4 (Crystal No. 166490), dated Nov. 12, 2002, pp. 1-2.
Creation record of Growth 7131-6, dated Nov. 14, 2002, pp. 1-2.
Creation record of Growth 7131-11 (Crystal No. 167146), dated Dec. 17, 2002, pp. 1-2.
Creation record of Growth 7131-17 (Crystal No. 167761), dated Jan. 10, 2003, pp. 1-2.
Creation record of Growth 7131-18 (Crystal No. 167795), dated Jan. 11, 2003, pp. 1-2.

(56) References Cited

OTHER PUBLICATIONS

Creation record of Growth 7131-20 (Crystal No. 167890), dated Jan. 15, 2003, pp. 1-2.
Summary of crystal annealing records, dated Nov. 20, 2006.
Hoshikawa Keigo et al., "Growth of Single-Crystal Sapphire Ribbon through EFG", Applied Physics, vol. 46, No. 9 (1977), pp. 1-5E.
"Alon Optical Ceramic—Comparison to Window Materials", Surmet Corp., Company Literature #M301030, 1 page, date unknown.
Non-Final Office Action for U.S. Appl. No. 15/707,585 dated Dec. 8, 2017, pp. 1-56.

\* cited by examiner

US 9,926,645 B2

METHOD OF FORMING A SINGLE CRYSTAL SHEET USING A DIE HAVING A THERMAL GRADIENT ALONG ITS LENGTH

CROSS-REFERENCE TO RELATED APPLICATIONS

The present application is a continuation application of U.S. patent application Ser. No. 14/176,437, filed Feb. 10, 2014, entitled "A Melt Fixture Including Thermal Shields Having a Stepped Configuration," by Locher et al., which is a divisional application of U.S. patent application Ser. No. 13/396,288, filed Feb. 14, 2012, entitled "Method of Forming a Sapphire Crystals Using Melt Fixture Including Thermal Shields Having a Stepped Configuration," by Locher et al., now U.S. Pat. No. 8,685,161, which is a continuation application of U.S. patent application Ser. No. 12/021,758, filed Jan. 29, 2008, entitled "Method of Forming a Sapphire Single Crystal," by Locher et al., now U.S. Pat. No. 8,157,913, which is a divisional application of U.S. patent application Ser. No. 10/820,468, filed Apr. 8, 2004 entitled "Single Crystals and Methods for Fabricating Same," by Locher et al., now U.S. Pat. No. 7,348,076, all of which are incorporated by reference herein in their entireties.

BACKGROUND

Field of the Invention

The present invention is generally drawn to single crystal components, and particularly to single crystal sheets, methods for forming such sheets, and processing equipment used in connection with the formation of single crystal sheets.

Description of the Related Art

Single crystals such as sapphire have been a material of choice for demanding, high performance optical applications, including various military and commercial applications. Single crystal sapphire possesses good optical performance within the 200 to 5000 nanometer range, and additionally possesses desirable mechanical characteristics, such as extreme hardness, strength, erosion resistance, and chemical stability in harsh environments.

While certain demanding high performance applications have taken advantage of single crystal sapphire, its implementation has not been widespread partly due to cost and size limitations due to forming technologies. In this regard, single crystal sapphire in the form of sheets is one geometric configuration that holds much industrial promise. However, scaling size while controlling processing costs has been a challenge in the industry. For example, processing equipment has not been adequately developed for the repeatable production of large-sized sheets, and additionally, processing techniques have not been developed for reliable manufacture.

A publication entitled "Large Diameter Sapphire Window from Single Crystal Sheets" from the Proceedings of the Fifth DOD Electromagnetic Window Symposium, Volume I (October 1993) provides a description of sapphire sheet processing (co-authored by the present inventor). However, the technology described in the paper is confined, particularly limited to moderate sheet sizes.

In light of the foregoing, the industry continues to demand large-sized single crystal sheets that can be produced in a cost-effective manner, such that improved size and reduced cost enable the implementation of sheets in various applications that, to date, have not been exploited. In addition, there is a particular demand for large-sized sapphire sheets.

SUMMARY

According to a first aspect of the present invention, a sapphire single crystal is provided. The sapphire single crystal is in the form of a sheet having a length>width>>thickness, the width not being less than 15 centimeters and the thickness being not less than about 0.5 centimeters.

According to another aspect, a sapphire single crystal is provided, in the form of a sheet having a length>width>thickness, the width being not less than 15 centimeters and a variation in thickness of not greater than 0.2 centimeters.

According to yet another aspect, a sapphire single crystal is provided, comprised of an as-grown single crystal sheet having a main body and a neck. The main body has first and second opposite lateral sides that are generally parallel to each other, a transition of the neck to the main body being defined by respective ends or transition points of the first and second opposite lateral sides. According to a particular feature, the single crystal sheet has a $\Delta_T$ that is not greater than 4.0 centimeters. $\Delta_T$ is the distance by which the first and second transition points are spaced apart from each other, as projected along a length segment of the single crystal sheet.

According to yet another aspect, a method of forming a single crystal is provided in which a melt is provided in a crucible having a die. The thermal gradient along the die is dynamically adjusted, and a single crystal is drawn from the die.

According to another aspect, a method of forming a single crystal is provided, including providing a melt, drawing a single crystal from the die, and pulling the single crystal upward from the die and into an afterheater. The afterheater has a lower compartment and an upper compartment separated from each other by an isolation structure.

According to yet another aspect, a method of forming a single crystal is provided, including providing a melt in a crucible of a melt fixture. The melt fixture has a die open to the crucible and a plurality of thermal shields overlying the crucible and the die, the thermal shields having a configuration to provide a static temperature gradient along the die, such that temperature is at a maximum at about the midpoint of the die. The single crystal is drawn from the die.

According to another aspect, melt fixtures are also provided. In one aspect, the melt fixture has a shield assembly providing a desirable static temperature gradient. In another aspect, the melt fixture includes an adjustable gradient trim device.

DESCRIPTION OF THE PREFERRED EMBODIMENT(S)

According to various embodiments of the present invention, new sapphire single crystals, a crystal growth apparatus, particularly, an EFG growth apparatus, and methods for growing single crystals are provided. Description of these various embodiments begins with a discussion of the EFG growth apparatus 10 illustrated in FIGS. 1 and 2. As used herein, the term EFG refers to the Edge-Defined-Film-Fed Growth technique, a technique that is generally understood in the industry of single crystal fabrication, and particularly include EFG as applied to sapphire single crystal growth.

Figure 1:
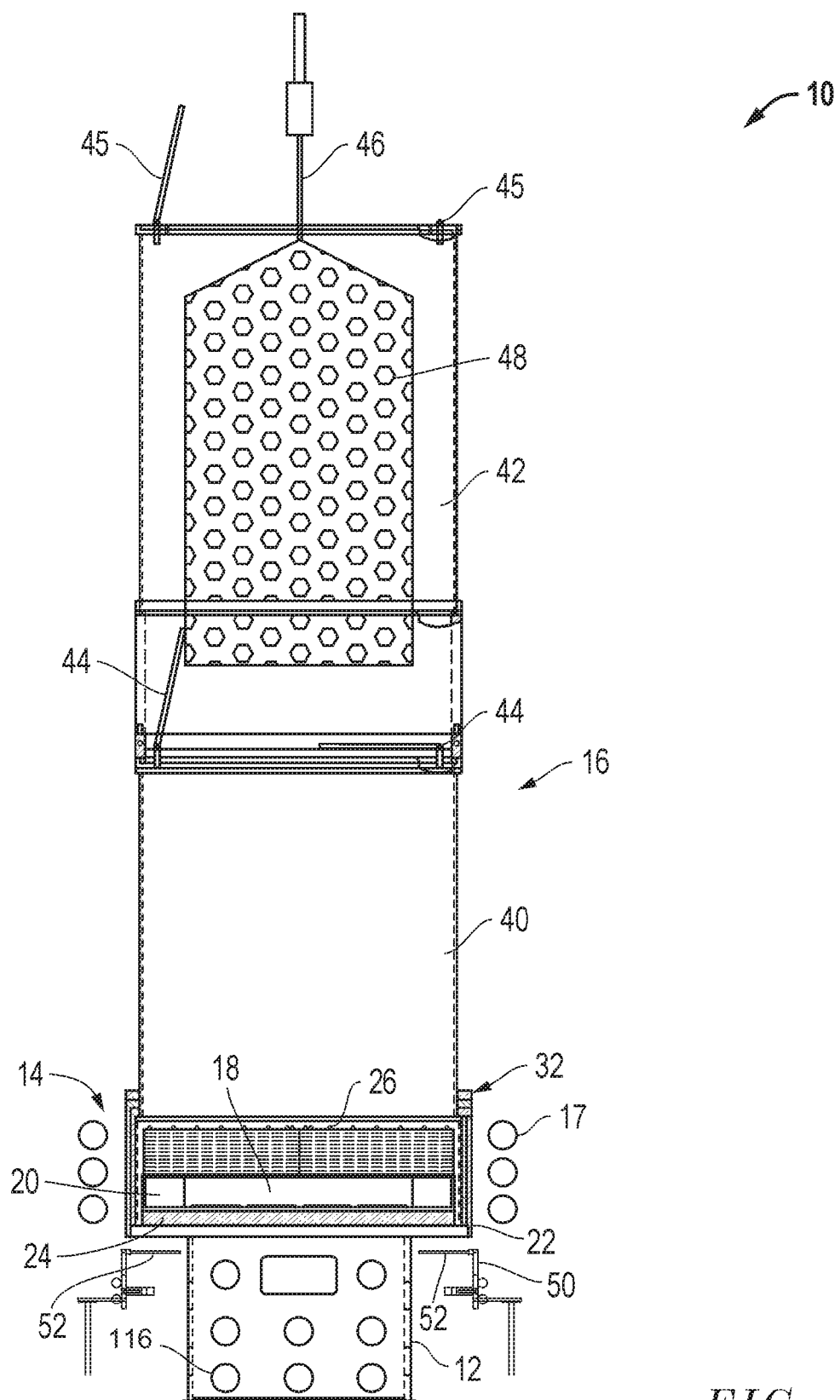
FIGS. 1 and 2 illustrate front and side schematic views of a crystal growth apparatus according to an embodiment of the present invention.
Figure 2:
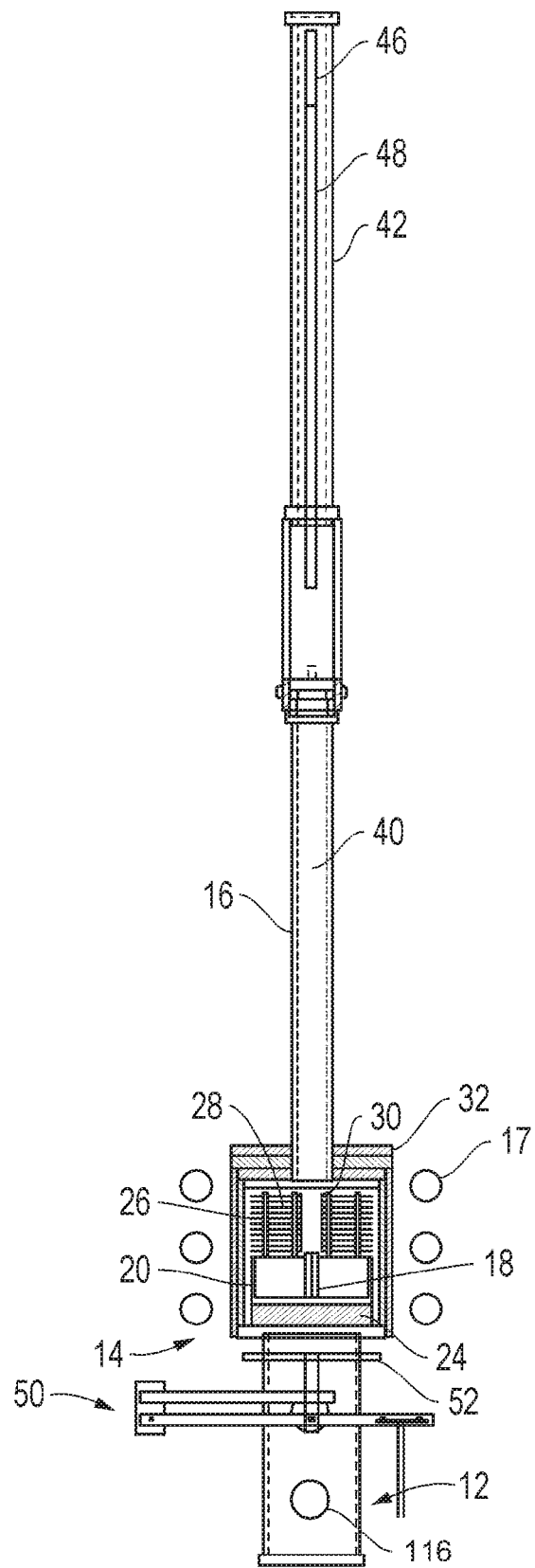

Turning to FIGS. 1 and 2, EFG growth apparatus 10 includes several main components, including a pedestal 12 supporting melt fixture 14, which is open to and communicates with afterheater 16. Pedestal 12 is generally provided to mechanically support the apparatus while thermally isolating the melt fixture 14 from the work surface on which the EFG apparatus is provided, to attenuate heat transmission from the melt fixture 14 to the work surface. In this context, the pedestal 12 is generally formed of a refractory material capable of withstanding elevated temperatures on the order of 2,000° C. While various refractory metals and ceramics may be utilized, graphite is particularly suited for the pedestal 12. Vent holes 16 are provided in pedestal 12 to further improve thermal isolation.

Turning to melt fixture 14, crucible 20 is provided for containing the melt that is utilized as the raw material for forming the single crystal. In the context of sapphire single crystals, the raw material is a melt from alumina raw material. The crucible 20 is typically formed of a refractory metal that is adapted to be heated through exposure to the field generated by an inductive heating element 17. The crucible is desirably formed of molybdenum (Mo) although other materials may be utilized such as tungsten, tantalum, iridium, platinum, nickel, and in the case of growth of silicon single crystals, graphite. More generally speaking, the materials are desired to have higher a melting point than the crystal being drawn, should be wet by the melt, and not react chemically with the melt. The inductive heating element 17 illustrated is an RF coil, having multiple turns forming a helix. Within the crucible 20, a die 18 is provided, which extends into the depth of the crucible, the die 18 having a center channel that is open through a crucible lid 21 (see FIG. 3) and generally exposed to afterheater 16 (described in more detail below). The die 18 is alternatively referred to as a "shaper" in the art.

Further, the melt fixture 14 includes a shield assembly 26 that is formed of a plurality of horizontal and vertical shields discussed in more detail below. The melt fixture 14 is generally mechanically supported by a support plate 22 overlying pedestal 12. Thermal insulation is provided by bottom insulation 24 as well as insulation layers 32 generally surrounding the lateral sides and top of the melt fixture 14. The bottom insulation 24 and the insulation layers 32 may be formed of graphite felt, for example, although other insulation materials may be utilized such as low conductivity rigid graphite board (such as Fiberform from FMI Inc.); other materials are, when thermodynamically compatible, alumina felt and insulating materials; zirconia felt and insulation; aluminum nitride, and fused silica (quartz). The shield assembly 26 includes horizontal shields 28 and vertical shields 30, which may also be seen in FIGS. 3 and 5.

The next major structural component of the EFG growth apparatus 10 is the afterheater 16 that includes a lower compartment 40 and an upper compartment 42. The upper and lower compartments are separated from each other by an isolation structure. In the particular embodiment shown in FIGS. 1 and 2, the isolation structure illustrated is formed by lower isolation doors 44. For illustration, one of the doors is provided in the closed position and the other of the doors in the open position. A second isolation structure is also provided to separate the afterheater 16 from the external environment. In the embodiment shown in FIGS. 1 and 2, the upper isolation structure is formed by upper isolation doors 45.

While a more detailed discussion is provided below regarding the growth process and operation of the EFG growth apparatus, the process generally calls for lowering a seed crystal 46 through the afterheater 16 to make contact with the liquid that is present at the top of the die 18, exposed through the crucible lid and to the afterheater 16. In the embodiment illustrated, the afterheater is passive, that is, does not contain active heating elements. However, the after heater may be active, incorporating temperature control elements such as heating elements. After initial growth, the seed crystal is raised and the growing single crystal 48 spreads to form a neck portion, having a growing width but which is less than the length of the die. The neck portion spreads to full width, initiating the growth of the full width portion or main body of the single crystal. The single crystal is then raised through the afterheater, first through lower compartment 40 and then into upper compartment 42. As the single crystal 48 translates into the upper compartment 42, the isolation doors 44 automatically close behind, thereby isolating the upper compartment 42 and the single crystal 48 from the lower compartment 40 and melt fixture 14.

The isolation structure in the form of the lower insulation doors 44 provides several functions. For example, in the case of catastrophic failure of crystal 48 during cooling, the resulting debris is prevented from impacting the relatively sensitive melt fixture 14. In addition, the isolation doors 44 may provide thermal insulation, to provide a controlled cooling environment in the upper compartment 42, thereby controlling cooling rate in the upper compartment 42.

In further reference to FIGS. 1 and 2 a gradient trim system 50 is provided. Gradient trim system 50 functions to dynamically adjust a thermal gradient along the length of the die 18. The gradient trim system 50 includes upper thermal shields 52 provided at opposite ends of the melt fixture, the thermal shields being adapted to be positioned at various heights by manipulating a linkage mechanism to adjust the thermal gradient along the length of the die. The thermal shields 52 may be embodied to function as active heating elements through induction heating by inductive heating element 17, or maybe embodied to reflect ambient thermal energy. In the latter case, graphite sheets are particularly useful such as Grafoil™ (such as available from Fiber Materials Inc. (FMI Inc.) of Biddeford, Me.).

Figure 3:
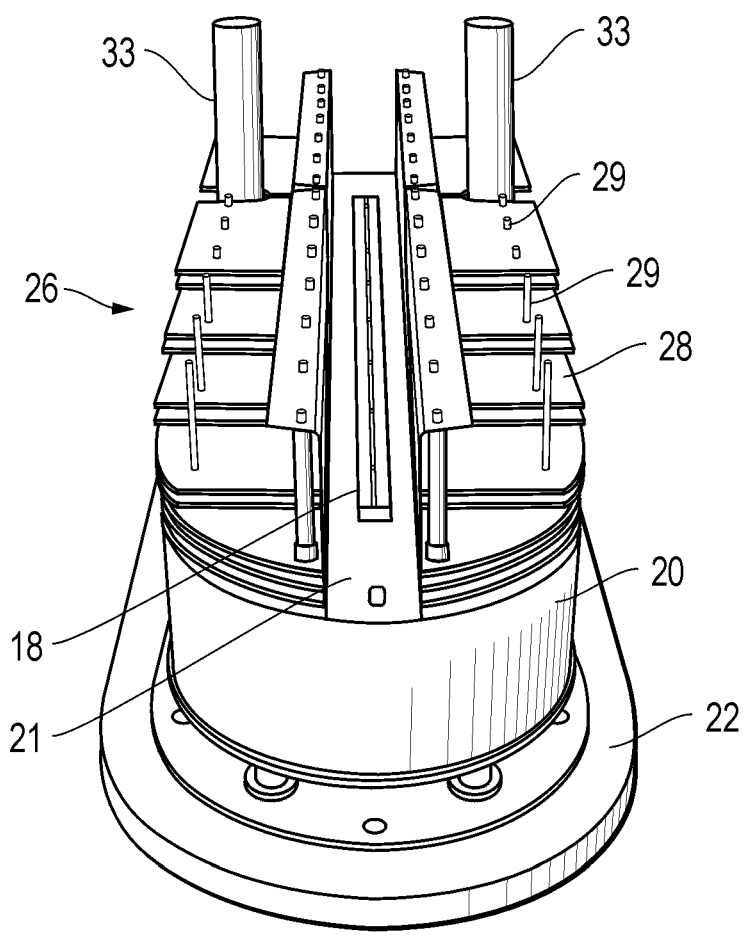
FIG. 3 illustrates an end perspective view of a melt fixture according to an embodiment of the present invention, which forms a component of the crystal growth apparatus shown in FIGS. 1 and 2.
Figure 4:
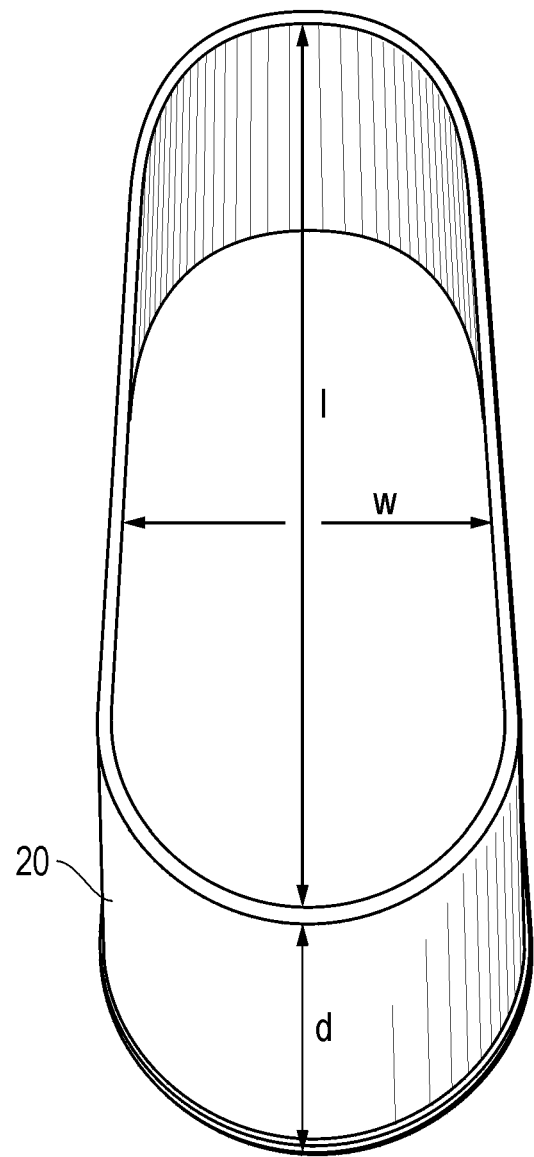
FIG. 4 illustrates dimensions of the crucible of the melt fixture shown in FIG. 3.
Figure 5:
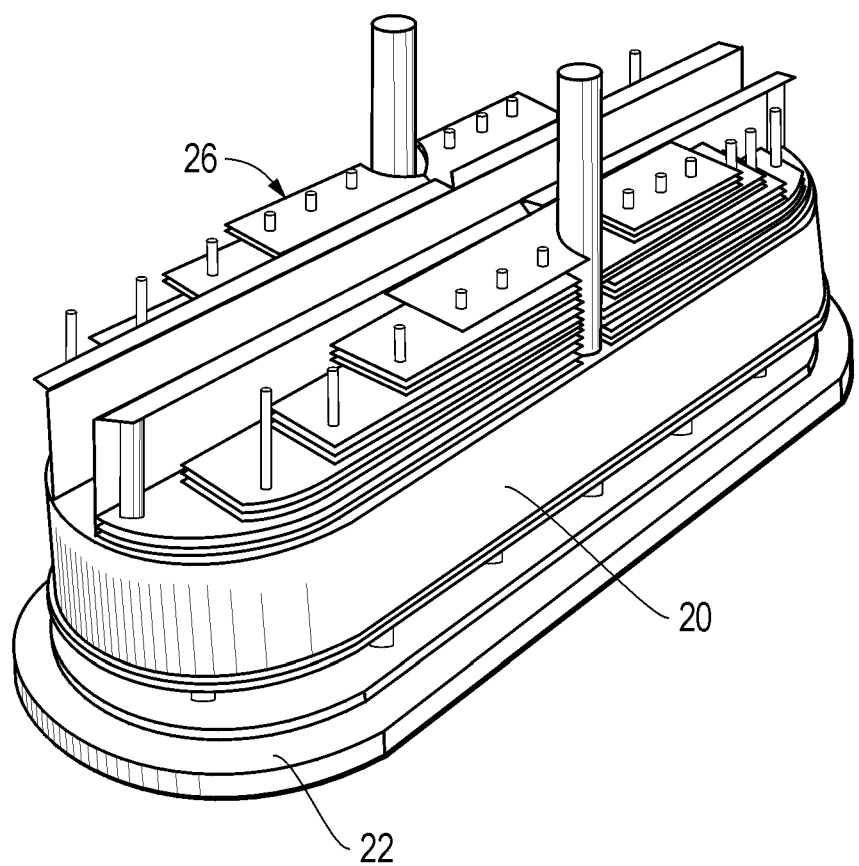
FIG. 5 illustrates an elevated perspective view of the melt fixture shown in FIG. 3.

Turning to FIGS. 3-5, various features of melt fixture 14 are illustrated. As shown, the melt fixture includes crucible 20 supported by support plate 22. Further, the crucible 20 is closed off by crucible lid 21, over which the shield assembly 26 is provided. Shield assembly 26 includes the horizontal shields 28 as illustrated, which are positioned by shield pins 29. Horizontal shields are shown generally as plates having a planar geometry, although other contours may be utilized.

The horizontal shields are configured to shape the static (baseline) thermal profile, which can be further manipulated as discussed hereinbelow. The shields may be formed of a material to reflect thermal energy, or may actively be heated in the presence of the inductive field.

According to a particular feature, the horizontal shields 28 are divided into first and second shield sets respectively positioned along first and second lateral sides of the die 18. Each of the shield sets is generally symmetrical about a vertical central axis. In the embodiment shown in FIGS. 3 and 5, the vertical central axis extends along the central bore of feed tubes 33, through which the raw material is fed into the crucible to form the melt. Of particular significance, the horizontal shields 28 form a stepped configuration forming opposing slopes that are oriented toward the central axis. As illustrated, adjacent overlying shield pairs are progressively shorter, to define the sloping and stepped configuration.

According to another feature, the crucible has an elongated structure, that is, has a structure in which the horizontal cross section is not circular. In reference to FIG. 4, the crucible has a length l, a width w, and a depth d, wherein an aspect ratio defined as l:w is not less than 2:1. As shown in FIG. 4, the length and width of the crucible 20 are mutually perpendicular, and represent the internal dimensions of the crucible. According to certain embodiments, the aspect ratio is not less than 3:1, such as not less than 4:1. While the cross-sectional shape of the crucible 20 is generally oval, other embodiments may be rectangular or polygonal, while still maintaining the foregoing aspect ratio features. The inductive heating element 17 shown in FIGS. 1 and 2 also has an aspect ratio similar to that of the crucible, namely being greater than 2:1. A comparison of the length of the coils shown in FIG. 1 to the width of the coils shown in FIG. 2 illustrates this feature.

Now focusing on operation of the EFG growth apparatus 10, typically crystal growth begins with formation of a melt in the crucible. Here, the crucible is filled with a feed material, $Al_2O_3$ in the case of sapphire. The feed material is generally provided by introduction through the feed tubes 33. The melt is initiated and maintained by inductive heating at a temperature of about 1950° C. to about 2200° C., by energizing inductive heating element 17 having a plurality of inductive heating coils. Heating by induction is effected by heating of the crucible 20, transmitting thermal energy into the material contained therein. The melt wets the die 18, forming a layer of liquid at the surface of the die.

After formation of a stable melt in the crucible, the seed crystal 46 is lowered through the afterheater 16, to contact the liquid at the die opening. After contact of the seed crystal with the melt at the die opening, the liquid film of the melt extending from the die to the seed is observed and temperature and temperature gradient (discussed below) are adjusted to reach a film height, such as on the order of 0.3 to 2.0 millimeters. At this point, the seed crystal is slowly raised such that upon raising the crystal into the lower compartment of the afterheater 40 the lower temperature causes crystallization of the liquid melt, forming a single crystal. The seed crystal is generally raised within a range of about 3 to 30 centimeters per hour, such as within a range of 3 to 15 centimeters per hour or 3 to 10 centimeters per hour.

At this point in the crystal growing process, a neck is grown, representing a sub-maximum width of the single crystal. Turning briefly to the full-length single crystal 100 shown in FIG. 6, the single crystal 100 includes a main body 102 and a neck 104, wherein the transition from the neck to the main body is labeled T. The initial portion of the neck extending from the distal end 106 is desired to have a minimum geometry, such as on the order of a few centimeters long, and having a thickness corresponding to at least one half the width of the die. Once assuring that the initial growth of the neck is desirable, the balance of the neck is grown by lowering the pull speed to be on the order of 0.1 cm/hr to about 20 cm/hr, often times within a range of about 0.1 cm/hr to about 10 cm/hr, more particularly, 0.5 cm/hr to 5 cm/hr. Additionally, the temperature may be lowered to be on the order of 10° C. to 100° C. lower, such as 10° C. to 50° C. lower than the initial starting temperature of the process.

Upon continued pulling of the seed crystal 46, the neck widens to maximum width, which is the length of the die 18. Of significance, it is desired that the neck spreads uniformly and symmetrically to opposite ends of the die during the pulling process, such that the height difference between the initiation of the main body portion defined by the transition of opposite lateral sides of the main body, are within about 4 centimeters of each other, as projected along the vertical height of the crystal.

Figure 6:
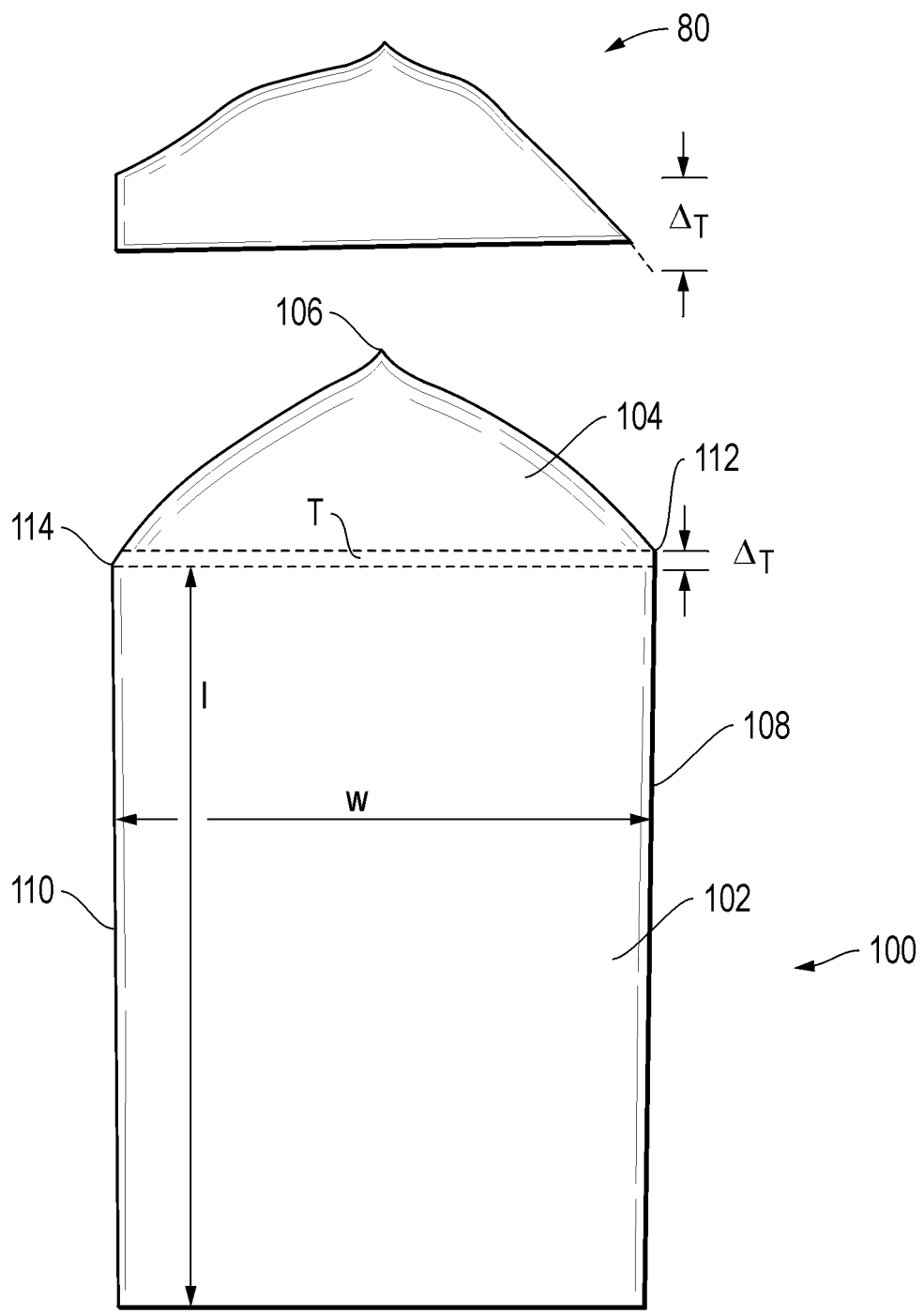
FIG. 6 shows two as-grown sapphire single crystals.

Turing back to FIG. 6, an illustration of two difference crystals is provided, demonstrating a difference in spread uniformity. The first crystal 80 represents a partial neck portion of a rejected (out-of-spec) single crystal, while crystal 100 represents an as-formed full-length crystal that was acceptable for further processing into useful components. Crystal 100 includes a main body 102 and a neck 104, wherein the transition from the neck 104 to the main body during growth happens along transition zone T as labeled. Generally, the neck 104 has an increasing thickness form the distal end 106 to the transition zone T. As shown, the main body 102 includes first and second opposite lateral sides 108, 110 that are generally parallel to each other, wherein the end point of each of the sides 108 and 110 is defined by respective lateral transitions from the neck 104 to the main body 100, representing full width. The first lateral side 108 includes an end point defined by transition point 112, and similarly, lateral side 110 includes an end point defined by transition point 114. The transition points 112, 114 are projected perpendicularly along a length segment (or long axis) of the single crystal sheet and the distance by which the respective transition points 112 and 114 are spaced apart along that length are represented by $\Delta_T$, representing a difference in heights between transition points of the opposite lateral sides of 108 and 110 of the main body 102. Desirably, $\Delta_T$ is not greater than about 4.0 centimeters, such as not greater than about 3.0 centimeters, in particular, not greater than about 2.0, 1.5, 1.0, 0.8, or even 0.7 centimeters. Ideally, $\Delta_T$ is zero although practically a zero delta is difficult to reproduce.

If the $\Delta_T$ is greater than a predetermined spec, such as 4.0 centimeters, the crystal is pulled free from the melt, discarded, and a growth operation is reinitiated. An out of spec crystal is illustrated in FIG. 6 as crystal 80.

An excessively high $\Delta_T$ generally corresponds to undesirable thickness variations across the width of the crystal, causing internal stresses and attendant low yield rates, as well as processing issues in fabrication of optical components from the crystal. High $\Delta_T$ is related to high thermal gradients along the length of the die. Accordingly, pursuant to a particular feature, the thermal gradient along the length of the die is adjusted to provide for growth of a single crystal having a $\Delta_T$ that is within spec.

Turning back to FIGS. 1 and 2, the thermal gradient may be adjusted by manipulating the gradient trim system 50 having first and second heat shields provided at opposite ends of the die. In the particular embodiment shown in FIGS. 1 and 2, raising a shield at a particular end raises the temperature at that end, while lowering the shield lowers the temperature at that end of the die. Temperature readings (e.g., from a pyrometer or thermocouples) along the length of the die guide the adjustment of gradient trim system 50. Typically, the thermal gradient is reduced to a value of not greater than about 0.6° C./cm along a length of the die during the drawing operation. Other embodiments have an even further reduced thermal gradient such as on the order of 0.4, or even 0.3° C./cm. Alternatively, the thermal gradient is reduced to a value of not greater than about 20° C., such as not greater than 15° C. between the first and second opposite ends of the die during drawing.

The overall temperature profile along the length of the die is generally such that the center of the die has the highest temperature, with temperature falling off to the edges of the die. Ideally, the curve is symmetrical, where temperature from the center to each end of the die falls off uniformly, creating generally similar temperature gradients from the center of the die to each end of the die. Noteworthy, the shape of the shield assembly (discussed above), is chosen to provide the desired static shape of the temperature profile. As such, the shields, acting as heating elements are typically symmetrical about an axis bisecting the die, and have a height that is at its maximum at the center of the die, gradually decreasing to a minimum at opposite ends of the die.

Typically, the adjustment is carried out prior to growth of a single crystal, which includes adjustment between growth of individual single crystals, such as between the growth of the first single crystal 80 and the growth of the second single crystal 100. In either case, dynamic adjustment of the thermal gradient is typically carried out after the formation of the melt in the crucible. Still further, the thermal gradient may be adjusted during the growth of the single crystal, that is, during the pulling of the seed crystal so as to grow and draw the single crystal.

While adjustment of the thermal gradient has been described herein in connection with use of the gradient trim system 50 that includes thermal shields, other gradient trim systems may be utilized. For example, thermal shields may be replaced with heat sinks, which act to draw heat away from the die. In the manner known in the art, heat sinks may take on the form of a heat exchanger, such as those that have a fluid flowing therethrough for carrying thermal energy away from the heat sink. The amount of thermal energy drawn away from either end of the die may be adjusted by manipulating the temperature of the fluid flowing through the heat exchanger, such as through use of a thermostat provided in-line within the fluid flow system, and/or adjusting flow rates. Alternatively, the position of the heat sink may be adjusted to modify the amount of thermal energy drawn from the respective end of the die.

Upon the creation of a full-length single crystal having a $\Delta_T$ that is within spec, the single crystal is broken free from the melt by pulling, and temperature is stabilized by maintaining the single crystal within the lower compartment 40 of the afterheater 16. Thereafter, the single crystal is pulled to enter upper compartment 42, during which a controlled cooling of the crystal is effected. Typically, cooling is carried out at a rate not greater than about 300° C./hr, such as not greater than about 200, 150, or even 100° C./hr. According to an embodiment, the cooling rate is not less than about 50° C./hr., such as within a range of about 50 to 100° C./hr. The relatively slow cooling rates are generally dictated by several parameters, including the mass of the crystal. Here, in the case of relatively large single crystals, it is not uncommon that the single crystal to have a mass greater than about 4 kg, such as greater than about 5 or 6 kg, such as on the order of 7 kg.

Following the drawing and cool down of the single crystal, machining operations are typically effected. It is generally desired that the single crystal be near-net shape, but oftentimes machining is effected to form the single crystal into the desired geometric configurations for commercial use. Accordingly, grinding, lapping, polishing and the like, or bulk material removal/shaping such as wire sawing or cleaving and the like may be utilized to manipulate the single crystal into a desired component or components, such as optical windows for bar codes scanners, optical windows for infrared and laser guidance, sensing and targeting systems in military operations, optical windows for infrared and visible wavelength vision systems. The optical window in such implementations may function to act as a window that is scratch and erosion resistant while being transparent in the infrared and visible wavelength spectrums. Other applications include transparent armor, such as bullet resistant windshields made of composites that include large sheets of sapphire.

Turning to the single crystal itself, the single crystal is in the form of alumina single crystal (sapphire). Typically, the single crystal is relatively wide, such as having a width not less than about 15 cm, such as not less than about 17, 20, 22, 25, or even 28 cm. The width corresponds to the length of the die during the drawing operation, the die determining the desired maximum width of the crystal. Further, according to a particular feature, the average thickness is not less than about 0.5 cm, such as not less than 0.6, 0.7, 0.8, or even 0.9 cm.

Further, the single crystal typically has a relatively confined variation in thickness, having a variation not greater than about 0.2 cm. Here, variation in thickness corresponds to the maximum thickness variation along a segment spanning the width of the main body of the single crystal sheet. Ideally, the maximum thickness variation corresponds to substantially the majority of all width segments along the main body, generally denoting a maximum thickness variation along the majority of main body of the single crystal.

Examples

Example 1, a crystal having dimensions 305±3×475±10×9.3±0.8 (W×L×T in mm). The following process flow was used to form Example 1.
   a. Set up furnace with growth components: crucible, die, shields and insulation package (hotzone).
   b. Purge chamber for 2 hours at 40 scfm Argon.
   c. Turn on power 150 kW supply.
   d. Ramp power @ 0.625% per minute to a temperature set point of 1950° C.
   e. Manually adjust temperature until melting ($T_m$) is observed.
   f. Manually adjust temperature from $T_m$ to $T_m$+60° C.
   g. Start feeder and add 4100 g feed material into crucible.
   h. Allow melt to stabilize for 1 hour.
   i. Lower seed and contact die at mid point.
   j. Adjust temperature so that approximately 1 mm of liquid film separates seed crystal and die ($T_n$).
   k. Start upward translation of puller at 75 mm/hr.
   l. Grow neck of crystal for 25 mm, inspect for uniform cross section and sufficient width, such as approximately ½ the width of the die. If neck is not uniform, break crystal free and adjust temperature gradient and reinitiate growth process for a new crystal.

m. Adjust temperature to $T_n-40°$ C. and lower pull speed to 25 mm/hr.
n. Allow crystal to spread to edges of die. If crystal does not spread uniformly to edges of die, break crystal free and adjust temperature gradient and reinitiate growth process for a new crystal
o. Start feeder once 50 mm length of growth has been reached and add feed material at a rate of 2.2 g/min—for a total of 2250 g over the course of the growth run.
p. Adjust the temperature and/or temperature gradient to maintain uniform liquid film height of 0.3±0.1 mm at die interface while growing body of crystal at 25 mm/hr.
q. When full width crystal has reached a length of 485 mm pull the crystal free of die by increasing pull rate to 7500 mm/hr for a length of 8 mm
r. When bottom of crystal reaches 8 mm above die lower the pull rate to 150 mm/hr until crystal bottom is 150 mm above the die.
s. Increase pull speed to 375 mm/hr until crystal emerges from hot zone at the top of the furnace.

Other Examples

For different size crystals, the amount of raw material fed into the melt fixture over the growth period changes to accommodate the different weight of the crystal. For example, the total weight for Example 1 was about 6350 g. For a 230×610×9.3 the total weight will be 6150 g. So in this second example, the initial charge is 4100 g and the amount charged in would be 2050 at 1.5 g/min (2050 grams/~24 hour growth (610 mm/25 mm/hr)). Generally, it is desirable to charge the incoming raw material generally uniformly through the growing process, over the whole length of the crystal.

Through use of various features of the embodiments of the present invention, such as utilization of a high aspect ratio crucible, high aspect ratio heating element, use of a gradient trim system, and introduction of a compartmentalized afterheater, sapphire single crystal sheets having the foregoing desirable geometric and mass features such as minimum width, thickness, and thickness variation features may be successfully formed. More particularly, use of a high aspect ratio crucible may improve process uniformity and repeatability, which use of a thermal gradient system for dynamically controlling the thermal gradient along the length of the die can be used to minimize the thermal gradient along the die, maximum temperature variations along the die, and accordingly provide for a symmetrical spread along the neck of the single crystal, contributing to thickness uniformity and the ability to grow relatively large mass and relatively thick crystals. While the prior art has reported success in the formation of moderately sized single crystals having limited width and/or thickness, embodiments of the present invention provide for improved process control and equipment enabling next generation, large sized single crystals, and in particular, single crystal sheets.

The above-disclosed subject matter is to be considered illustrative, and not restrictive, and the appended claims are intended to cover all such modifications, enhancements, and other embodiments, which fall within the scope of the present invention. For example, while certain embodiments focus on growth of large-sized sapphire, other single crystals may be fabricated utilizing the process techniques described herein. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a sapphire single crystal sheet, the method comprising providing a melt in a crucible having a die; and drawing the sapphire single crystal sheet from the die, wherein the sapphire single crystal sheet has a length, a width, and a thickness, wherein the length>width>thickness, the width is not less than 15 cm, and the thickness is not less than 0.5 cm, and a thermal gradient along a length of the die is not greater than 0.6° C./cm.

2. The method of claim 1, wherein drawing the sapphire single crystal sheet comprises raising the seed crystal at a rate of 3 cm/hour to 30 cm/hour.

3. The method of claim 1, wherein the thermal gradient is no greater than 0.4° C./cm.

4. The method of claim 1, wherein the thermal gradient is no greater than 0.3° C./cm.

5. The method of claim 1, further comprising machining the sapphire single crystal sheet to form a machined sapphire component.

6. The method of claim 5, wherein machining comprises grinding, lapping, polishing, or bulk material removal/shaping of the sapphire single crystal.

7. The method of claim 6, wherein machining the sapphire single crystal sheet comprises machining the sapphire single crystal sheet into an optical window.

8. The method of claim 7, wherein machining the sapphire single crystal sheet comprises machining the sapphire single crystal sheet into a geometric configuration for an infrared and laser guidance, a military sensing and targeting system or an infrared and visible wavelength vision system.

9. The method of claim 1, wherein the width of the sapphire single crystal sheet is not less than 22 cm.

10. The method of claim 1, wherein the width of the sapphire single crystal sheet is not less than 28 cm.

11. The method of claim 1, wherein the thickness of the sapphire single crystal sheet is not less than 0.6 cm.

12. The method of claim 1, wherein the sapphire single crystal sheet has a mass greater than 4 kg.

* * * * *